United States Patent [19]

DeFreitas

[11] Patent Number: 4,612,654

[45] Date of Patent: Sep. 16, 1986

[54] DIGITAL ENCODING CIRCUITRY

[75] Inventor: Richard E. DeFreitas, North Chelmsford, Mass.

[73] Assignee: Analog and Digital Systems, Inc., Wilmington, Mass.

[21] Appl. No.: 644,340

[22] Filed: Aug. 27, 1984

[51] Int. Cl.[4] .................. H03M 3/02; H04B 14/06
[52] U.S. Cl. ............................. 375/30; 375/33; 332/11 D
[58] Field of Search ............. 375/27, 28, 30, 32, 375/33; 332/11 D; 328/151; 340/347 AD

[56] References Cited

U.S. PATENT DOCUMENTS

| | | | |
|---|---|---|---|
| 3,757,252 | 9/1973 | Deschemes et al. | 375/32 |
| 3,868,574 | 2/1975 | Ferrieu | 375/30 |
| 3,878,465 | 4/1975 | Stephenne et al. | 375/30 |
| 4,254,502 | 3/1981 | DeFreitas et al. | 375/30 |
| 4,264,974 | 4/1981 | Crouse | 375/32 |

OTHER PUBLICATIONS

"The dbx Model 700 Digital Audio Processor", R-e/p, Oct. 1982.

*Primary Examiner*—Benedict V. Safourek

[57] ABSTRACT

Delta encoding circuitry of the type in which a digitally-encoded signal is determined by the difference between a present value of an input signal and a reconstructed signal representative of a past value of said input signal. The occurrence of a high or a low state in the digitally-encoded signal corresponds to an incremental change in the input signal of an amount dependent upon a reference signal determined from said digitally-encoded signal. The reference signal is increased by a positive-feedback circuit upon detection of one or more consecutive repetitions of the same digital state in the digitally-encoded signal.

15 Claims, 3 Drawing Figures

DIGITAL ENCODING CIRCUITRY

BACKGROUND OF THE INVENTION

This invention relates to digitally encoding and decoding electrical signals, particularly signals representative of music. In delta modulating and other similar systems, the digitally encoded signal stream (1's and 0's) represents the slope of each segment of the analog signal. A digital 1 means the analog slope is positive, and the decoder reconstructs the analog signal by increasing it a predetermined amount. A digital 0 causes the decoder to decrease the analog signal by the same amount. Thus, the reconstructed analog signal appears as a series of positively or negatively-sloped segments. The relative preponderance of 1's or 0's in the digital signal stream indicates whether the analog signal is rising, falling, or not changing.

The digital signal is encoded from an analog input by comparing, at each clock interval, the reconstructed (decoded) analog signal (the most recent output of the decoder, representative of a past value of the input to the encoder) with the present value of the input and generating a 0 if the input is less than the reconstructed signal and a 1 if the input is greater.

The major difficulty with such systems has been in choosing the amount by which to increase or decrease the reconstructed signal at each interval, i.e., the magnitude of the decoding slope. If the decoding slope chosen does not roughly match the slope of the input, there will be noticeable quantization noise or error in the reconstructed output. In systems where the decoding slope is held constant, the input can only accurately be encoded over a narrow range of amplitudes.

To overcome the limitations of using a constant decoding slope, the prior art has provided circuits for varying the size of the decoding slope in relation to the magnitude of the input. Such systems are often referred to as having adaptive delta modulation.

For example, in DeFreitas U.S. Pat. No. 4,254,502 circuitry is provided for operating on the digitally-encoded signal to generate what is called a reference signal that prescribes the decoding slope. A shift register and associated logic detects repetitions (or coincidences) of the same digital state (e.g., two 0's or two 1's), and supplies an output to a filter and detector circuit that, in turn, generates the reference signal. The magnitude of the signal supplied to the filter and detector is dependent on the number of coincidences in the digitally-encoded signal. If as many as four coincidences occur, indicating the need for a rapid increase in decoding slope, a positive feedback path is switched on to connect the output of the filter and detector circuit to its input.

SUMMARY OF THE INVENTION

In general the invention features a greatly simplified circuit for generating the reference signal. Instead of the filter and detector circuit, a positive-feedback circuit is the primary source of the reference signal. A coincidence detector activates the positive-feedback circuit upon detection of a preset number of state repetitions (e.g., three 1's or three 0's) in the digitally-encoded signal. Until deactivated by a break in the repetition, the positive-feedback circuit generates a constantly increasing reference signal. The rate of increase can be varied to tailor the system for particular circumstances. Moreover, the rate of increase is independent of the clock rate of the system because, once activated, the positive-feedback circuit increases the reference signal independently of the remainder of the circuit. This independence between the rate of increase of the reference signal and the clock rate allows the system to operate at a slower clock rate without as much degradation as would otherwise occur.

In preferred embodiments, the positive-feedback circuit is made the primary source of the reference signal by activating it before (or simultaneous with) activation of any other circuit for generating the reference signal and by assuring that increases in the reference signal caused by the positive-feedback circuit are greater than increases due to any other circuitry (preferably the positive-feedback circuit generates all such increases); a capacitor is charged when the positive-feedback circuit is activated and discharged when it is deactivated; the reference signal produced by the positive-feedback circuit rises exponentially; the time constant of rise is shorter than the time constant of decay.

PREFERRED EMBODIMENTS

The circuitry and operation of preferred embodiments of the invention will now be described.

DRAWINGS

CIRCUITRY

Figure 1:
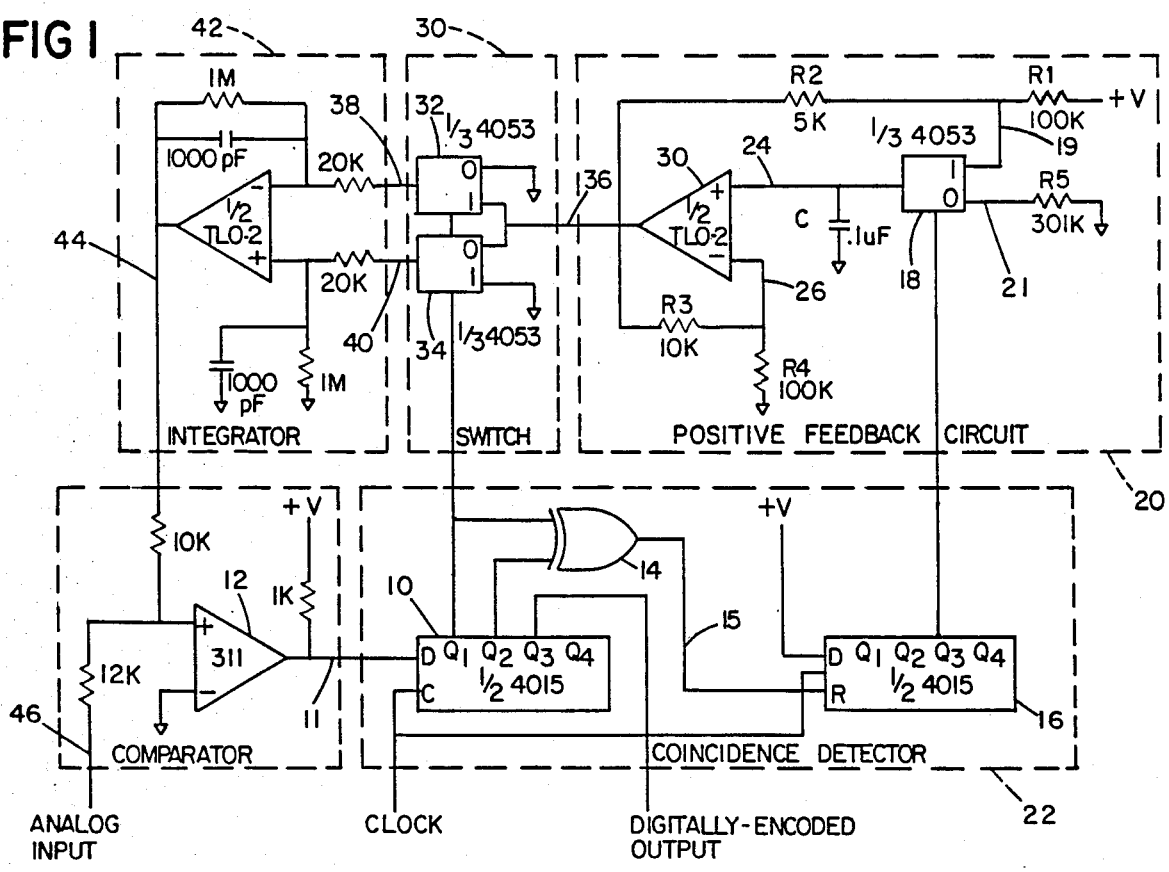
FIG. 1 is a circuit schematic of an encoder of the most preferred embodiment.

Referring to FIG. 1, a shift register 10 samples the output 11 of comparator 12 at each clock pulse. Register outputs Q1, Q2, Q3, Q4 hold the four most recent values of output 11. Outputs Q1, Q2 are connected to the inputs of exclusive-OR gate 14. Output Q4 is not used. Output Q3, which is identical to output Q1 but delayed two clock intervals, forms the digitally-encoded output. Output 15 of gate 14 is applied to the reset input of shift register 16, and a positive-reference voltage +V is applied to input D. Outputs Q1, Q2, and Q4 of register 16 are unused. Output Q3 is applied to solid-state switch 18, to selectively activate positive-feedback circuit 20. Shift registers 10, 16 and gate 14 together form a coincidence detector circuit 22.

Switch network 30 and integrator 42 process output 36 of the positive-feedback circuit. Output 36, the reference signal, is connected to one of two reference inputs 38, 40 of integrator 42 by two solid state switches 32, 34, which are controlled by the digital output Q1 of shift register 10. The integrator produces a maximum slope or slew rate of 0.33 volts per microsecond for a 10 V reference input. For simplicity, the integrator has a low-end break frequency of about 500 Hz. Integrator output 44, the reconstructed analog signal, is compared with analog input 46 at comparator 12.

One percent tolerance resistors are used throughout (except for the 1K resistor at the output of the comparator).

Comparator 12 produces an output signal 11 that alternates between zero and +V volts depending on the polarity of the difference between reconstructed analog signal 44 and analog input 46. Shift register 10 converts output 11 to a synchronized digital signal of 1's and 0's at its outputs Q1, Q2, Q3, Q4. Output Q1 has the most current digital value, and output Q2 the previous value.

Integrator 42 is controlled by switches 32, 34 in response to output Q1. If Q1 is a 1, switch 32 connects reference signal 36 to integrator input 38, and the integrator decreases the reconstructed output 44. If Q1 is a 0, switch 34 connects the reference signal to input 40, and the integrator increases the reconstructed output 44. The amount by which the reconstructed output is increased or decreased, i.e., the decoding slope, is set by the amplitude of reference signal 36.

The reference signal is determined by positive-feedback circuit 20, which is activated when output Q3 of shift register 16 is a 1. The reference, and thus the decoding slope, is increased whenever the digital signal exhibits three or more repeated 1's or 0's (three or more consecutive coincidences), as this is an indication that the slope is inadequate to follow the input.

Exclusive-OR gate 14 senses whether there is repetition in the digital signal. It generates a 1 at its output only if the present and previous digital values are different (i.e., 1,0 or 0,1). Thus if the digital signal becomes a steady stream of 1's or a steady stream of 0's, output 15 of gate 14 is zero.

Shift register 16 produces outputs that indicate the length of a repetition of 1's or 0's in the digital signal. Exclusive-OR output 15 controls the reset input R, and a +V reference voltage is always applied to input D. Thus outputs Q1, Q2, Q3, Q4 will remain zero if output 15 continues to exhibit 1's, meaning no repetition in the digital signal. On the other hand, if output 15 goes to zero, meaning a string of two 1's or two 0's in the digital signal, the register shifts a 1 onto output Q1. And if output 15 remains zero for two clock intervals, meaning a string of three 1's or 0's, the register shifts a 1 onto both Q1 and Q2. Similarly, a string of four 1's or 0's produces 1's on outputs Q1, Q2, Q3, and five successive 1's or 0's produces 1's on all four register outputs.

Figure 2:
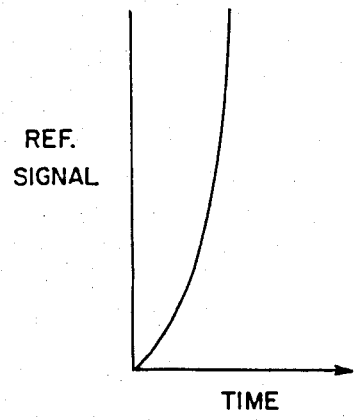
FIG. 2 is a plot of the transient characteristic of the reference voltage when that voltage is rising in value.

Only register output Q3 is used to generate the reference signal. When Q3 is a 1, switch 18 connects circuit path 19 to positive input 24 of differential operational amplifier 30. That causes the reference voltage 36 to grow exponentially with time. If positive-feedback circuit 20 has not been activated for some time, capacitor C will be discharged, and the transient characteristic of the reference voltage ($V_{Ref}$) has the form of a rising exponential as shown in FIG. 2, and as described by the relationship $$V_{Ref} = (V/k)(e^{kt/\tau} - 1)$$

where, V is the supply voltage, $k = (R_1 R_3 - R_2 R_4)/R_2 R_4$, and $\tau = R_1 C$.

The transient characteristic is chosen so that the reference signal initially rises more gradually than it does later on. In most circumstances the reference signal will never reach the steeply-ascending portion of the transient characteristic, as the adjustment in decoding slope achieved by the initial gradual increase will be enough to end the string of repetitions keeping register Q3 at 1. When Q3 goes to 0, switch 18 connects circuit path 21 to amplifier input 24, causing reference voltage 36 to decrease exponentially with a decay time constant (60 msec) determined by resistor $R_5$ and capacitor C. During normal operation, the reference voltage will remain in the gradually-rising normal range indicated in FIG. 2. The rate of rise of the reference signal is greater than its rate of decay. The slower rate of decay has the effect of maintaining the decoding slope at a high level for a short period even though a smaller decoding slope would more accurately encode the input signal. Although this produces more quantization noise than would result without the slow decay, the slow change in the amplitude of the quantization noise makes the noise less audible to the human ear.

A standby reference input is not required in the peak detector because a condition of all 0's in the digital signal will activate (via gate 14 and registers 10, 16) circuit 20 and produce a positive-reference voltage. The absence of the standby reference permits accurate encoding of very small input slopes, thereby extending the dynamic range of the system.

A decoder embodying the invention would employ similar circuitry to that shown for the encoder. Input D of shift register 10 would be the input for the digital signal, and output 44 of the integrator would be the reconstructed analog output. Comparator 12 would be omitted.

Figure 3:
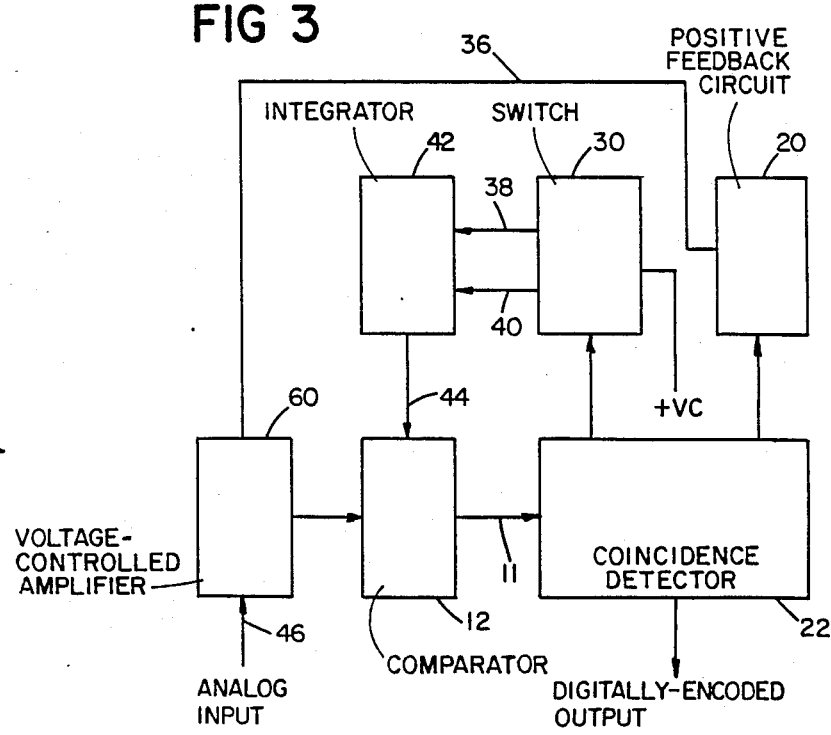
FIG. 3 is a schematic of another embodiment of the invention.

Other embodiments of the invention are within the following claims. For example, there is shown in FIG. 3 an equivalent arrangement to the one shown in FIG. 1. Rather than being used to prescribe the decoding slope of the integrator, the reference voltage 36 is used to control a voltage-controlled amplifier 60 which operates on the analog input 46. The input to the integrator remains constant (being prescribed by the constant voltage $V_c$).

Also, the invention may be applied to other encoding and decoding systems than delta modulation, including voltage to frequency modulators, pulse width modulators, delta sigma modulators, and pulse code modulation.

I claim:

1. An electrical system comprising means for generating a digitally-encoded signal with high and low states, wherein said digitally-encoded signal is determined at least in part by the difference between a present value of an input signal and a reconstructed signal representative of a past value of said input signal, and wherein the state of said digitally-encoded signal is redetermined at a clock frequency, increment-adjusting means for providing that the occurrence of a high or a low state in said digitally-encoded signal corresponds to an incremental change in said input signal of an amount dependent upon a reference signal determined from said digitally-encoded signal, and reference-signal-generating means including means for increasing the value of said reference signal upon detection of one or more consecutive repetitions of the same digital state in said digitally-encoded signal and decreasing said value upon detection of an end to said repetitions, wherein said increases in said reference signal are provided primarily by a clock-independent circuit, said circuit including means for increasing said reference signal at a rate independent of said clock frequency.

2. The system of claim 1 wherein said clock-independent circuit comprises a positive-feedback circuit comprising an amplifier, the output of which provides said reference signal, and wherein a positive feedback path is provided from said output to the input of said amplifier.

3. The system of claim 2 wherein said increment-adjusting means comprises an integrator in which the integration slope is determined from said reference signal.

4. The system of claim 2 wherein said increment-adjusting means comprises a variable gain amplifier operating on said input signal, the gain of said amplifier being determined from said reference signal.

5. The system of claim 2 wherein said reference-signal-generating means generates a coincidence signal when there has been detection of said one or more consecutive repetitions and wherein said positive-feedback circuit further comprises a switch adapted to complete said positive feedback path when activated by said coincidence signal.

6. The system of claim 4 wherein said positive-feedback circuit further comprises a charge-storage device such as a capacitor so connected that it charges when said positive feedback path is completed by said switch.

7. The system of claim 6 wherein said positive-feedback circuit further comprises a discharge circuit path from said charge-storage device to ground and wherein said switch is adapted to complete said circuit path when not activated by said coincidence signal.

8. The system of claim 7 wherein the time constant of charging when said switch is activated is less than the time constant of decay when said switch is not activated.

9. The system of claim 2 wherein said positive-feedback circuit includes means to cause said reference signal to rise with the transient characteristic of a rising exponential.

10. The system of claim 9 wherein the shape of said transient characteristic can be represented as $V_{ref} = (V/k)(e^{kt/\tau} - 1)$, where $V_{Ref}$ is the voltage of said reference signal, $V$ is constant voltage, $\tau$ is a time constant, and $k$ is a constant.

11. The system of claim 2 wherein said detection is of three said repetitions.

12. The system of claim 2 wherein said reference-signal-generating means comprises means for activating said positive-feedback circuit before or simultaneous with activation of any other circuit for generating said reference signal.

13. The system of claim 12 wherein said activation of said positive-feedback circuit is before any other said activation.

14. The system of claim 2 wherein said reference-signal-generating means is adapted so that increases in said reference signal due to said positive-feedback circuit are greater than any increases due to other circuitry.

15. The system of claim 2 wherein said reference-signal-generating means is adapted so that all said increases in said reference signal are provided by said positive-feedback circuit.

* * * * *